United States Patent
Fujiwara et al.

(10) Patent No.: US 11,061,088 B2
(45) Date of Patent: Jul. 13, 2021

(54) NMR PROBE SYSTEM AND METHOD OF USING NMR PROBE SYSTEM

(71) Applicants: Osaka University, Suita (JP); JEOL Ltd., Tokyo (JP)

(72) Inventors: Toshimichi Fujiwara, Suita (JP); Yoh Matsuki, Suita (JP); Yuki Endo, Tokyo (JP); Shinji Nakamura, Tokyo (JP); Hiroki Takahashi, Tokyo (JP)

(73) Assignees: Osaka University, Osaka (JP); JEOL Ltd., Tokyo (JP)

( * ) Notice: Subject to any disclaimer, the term of this patent is extended or adjusted under 35 U.S.C. 154(b) by 104 days.

(21) Appl. No.: 16/548,121

(22) Filed: Aug. 22, 2019

(65) Prior Publication Data
US 2020/0072917 A1    Mar. 5, 2020

(30) Foreign Application Priority Data

Aug. 31, 2018    (JP) .............................. JP2018-162455

(51) Int. Cl.
*G01R 33/30* (2006.01)
*G01R 33/36* (2006.01)
*G01R 33/28* (2006.01)

(52) U.S. Cl.
CPC ......... *G01R 33/305* (2013.01); *G01R 33/282* (2013.01); *G01R 33/307* (2013.01); *G01R 33/3635* (2013.01)

(58) Field of Classification Search
CPC .............. G01R 33/305; G01R 33/3635; G01R 33/282; G01R 33/307; G01R 33/28
See application file for complete search history.

(56) References Cited

U.S. PATENT DOCUMENTS

| 4,254,373 | A | * | 3/1981 | Lippmaa | ................ | G01R 33/31 324/321 |
| 8,766,631 | B2 | * | 7/2014 | Hofmann | ............. | G01R 33/307 324/307 |
| 2003/0085706 | A1 | | 5/2003 | Hasegawa | | |
| 2010/0116068 | A1 | * | 5/2010 | Oki | .......................... | G01N 1/22 73/863.21 |
| 2015/0048829 | A1 | | 2/2015 | De Paepe et al. | | |
| 2015/0338480 | A1 | | 11/2015 | Bouleau et al. | | |

(Continued)

FOREIGN PATENT DOCUMENTS

| JP | 01299448 A | * | 9/1987 |
| JP | 2003302452 A | | 10/2003 |

(Continued)

OTHER PUBLICATIONS

Japanese Office Action issued in JP2018-162455 dated Oct. 6, 2020.

(Continued)

*Primary Examiner* — Susan S Lee
(74) *Attorney, Agent, or Firm* — The Webb Law Firm

(57) ABSTRACT

A container has a sample installation unit and an NMR circuit therein, and is connected to a bearing gas supply path and a drive gas supply path for supplying gas to the inside of that container. This container is also connected to an exhaust path that exhausts the gas from the inside of the container. The exhaust path has a pressure control valve as an adjustment mechanism for adjusting the pressure in the container.

5 Claims, 9 Drawing Sheets

(56) References Cited

U.S. PATENT DOCUMENTS

2016/0223628 A1 8/2016 Fujiwara et al.
2017/0176362 A1* 6/2017 Endo ..................... G01R 33/31

FOREIGN PATENT DOCUMENTS

| JP | 2008203154 A | * | 9/2008 |
| JP | 2014130111 A | | 7/2014 |
| JP | 2015508162 A | | 3/2015 |
| JP | 2016142537 A | | 8/2016 |

OTHER PUBLICATIONS

Matsuki; Development and Application of Circulation-type, Cryogeinic Helium Gas-driven, DNP-MAS-NMP Probe; Bulletin of the Nuclear Magnetic Resonance Society of Japan; vol. 6; Apr. 23, 2015; pp. 85-88; English-language excerpt included.
Extended European Search Report issued in EP19193191.4 dated Jan. 30, 2020.

* cited by examiner

NMR PROBE SYSTEM AND METHOD OF USING NMR PROBE SYSTEM

CROSS-REFERENCE TO RELATED APPLICATION

This application claims priority to Japanese Patent Application No. 2018-162455 filed Aug. 31, 2018, the disclosure of which is hereby incorporated by reference in its entirety.

BACKGROUND OF THE INVENTION

Field of the Invention

The present disclosure relates to an NMR probe system and a method of using the NMR probe system.

Description of Related Art

A nuclear magnetic resonance (NMR) measurement apparatus is an apparatus for measuring a sample at the atomic level utilizing the NMR phenomenon in which atomic nuclei placed in a static magnetic field interact with electromagnetic waves of a specific frequency.

In the NMR measuring apparatus, an NMR probe including a container containing the sample is disposed in the static magnetic field generated by a superconducting magnet or the like. The container of the NMR probe has an electric circuit called an NMR circuit, and the NMR circuit emits radio waves to the sample and detects NMR signals from the sample. The NMR circuit usually includes, for example, a transmitting and receiving coil, a tuning circuit (e.g. variable capacitor for tuning), and a matching circuit (e.g. variable capacitor for matching).

In the NMR measurement apparatus, in order to enhance the sensitivity, cooled gas may be supplied into the container of the NMR probe to cool a sample tube and the NMR circuit. In addition, during measuring of a solid sample, in order to cancel the influence of differences in crystal orientation, the sample may be rotated at the so-called magic angle at high speed. In that case, it is known to cause the supplied gas to serve as a bearing for the sample tube and to drive the sample tube to rotate.

The NMR probe may release gas exhausted from the container into the atmosphere. There is also a case where gas is circulated between the NMR probe and a cooling device. For example, JP 2016-142537 A discloses an NMR measurement apparatus that circulates gas. This NMR measurement apparatus detects NMR signals by means of the dynamic nuclear polarization (DNP) method in which extremely low temperature helium gas is circulated, to thereby achieve highly accurate measurement and reduced running costs.

In the NMR circuit, when the applied voltage increases, discharge may occur. Occurrence of discharge may interfere with accurate measurement and lead to component failure. JP 2003-302452 A discloses a technique of preventing occurrence of discharge by improving the circuit design of the electric circuit in the NMR probe.

SUMMARY OF THE INVENTION

In the NMR circuit, even if its circuit design is improved, discharge is induced when the applied voltage is increased.

An object of the present disclosure is to achieve an NMR probe system provided with a new mechanism for preventing or reducing occurrence of discharge.

An NMR probe system according to the present disclosure has a container in which a sample installation unit and an NMR circuit are provided, supply paths that supply gas to an inside of the container, an exhaust path that exhausts the gas from inside the container, and an adjustment mechanism that is provided in the exhaust path and adjusts a pressure in the container.

A method of using the NMR probe system according to the present disclosure includes the step of changing the pressure in the container by the adjustment mechanism when the voltage applied to the NMR circuit is changed, or adjusting the pressure in the container by the adjustment mechanism when the type of gas supplied to the inside of the container is changed.

According to the present disclosure, by adjusting the pressure in the container of the NMR probe, it becomes possible to prevent or reduce occurrence of discharge.

BRIEF DESCRIPTION OF THE DRAWINGS

An embodiment of the present disclosure will be described based on the following figures, wherein.

Figure 1:
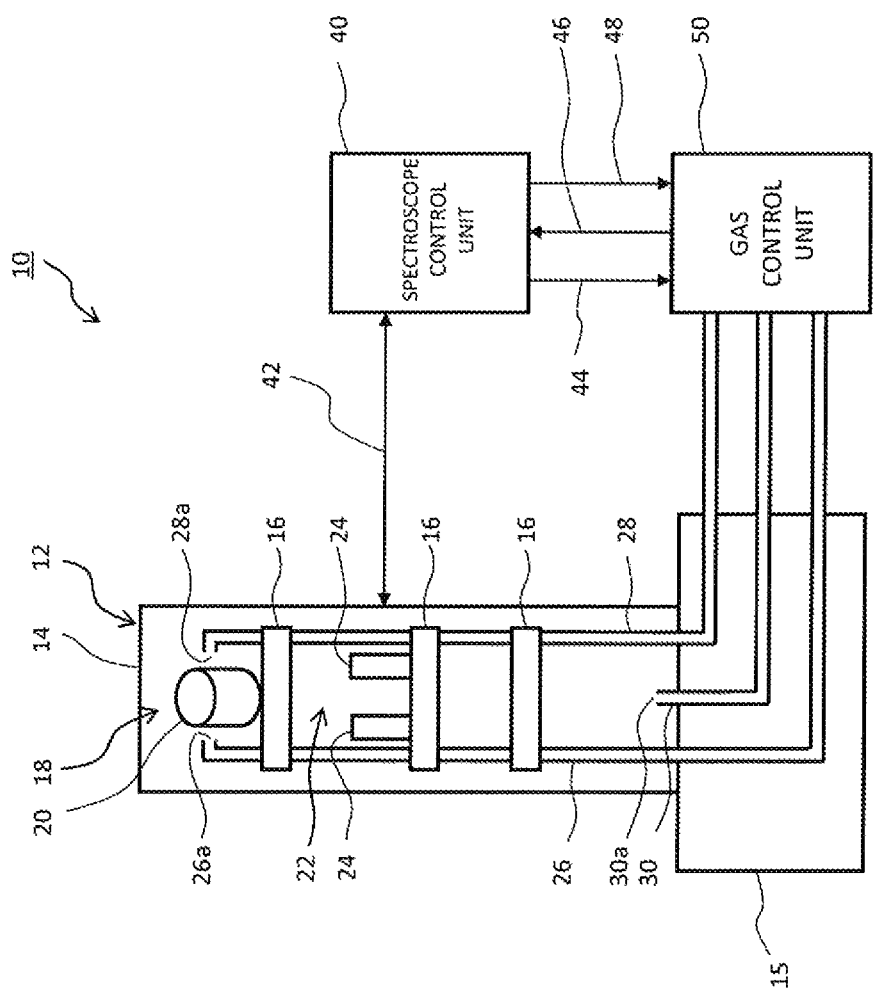
FIG. 1 is a schematic diagram showing the entire structure of an NMR probe system according to an embodiment.

DESCRIPTION OF THE INVENTION (A) Summary of Embodiment

An NMR probe system according to the embodiment has a container, supply paths, an exhaust path, and an adjustment mechanism provided in the exhaust path. In the container, a sample placement unit in which a sample is placed and an NMR circuit are provided. The supply paths are paths for supplying gas into the container, while the exhaust path is a path for exhausting the gas from the inside of the container. The exhaust path has the adjustment mechanism for adjusting the pressure in the container.

A device having the container, the supply paths, and the exhaust path that are made integrally with the container is usually called an NMR probe. The adjustment mechanism may be provided in the NMR probe or in the exhaust path connected to the NMR probe. In the present embodiment, these are referred to as an NMR probe system, in order to clearly indicate that not only the former aspect but also the latter aspect can be included. Gas supplied to the container may be cooling gas used for cooling purposes, or may be gas used for other purposes (e.g. for rotating the sample).

The adjustment mechanism is provided in the exhaust path (which includes an exhaust port of the container and a flow path downstream thereof) to adjust the pressure in the container. For example, a cross-section variable mechanism (such as, for example, a valve) for reducing the cross-sectional size of the exhaust path can be used as the adjustment mechanism. A pump for increasing the pressure in the exhaust path may also be used as the adjustment mechanism. If the pressure in the container is increased by means of the adjustment mechanism, the discharge start voltage in the NMR circuit is increased, and thus, it becomes possible to prevent or reduce occurrence of discharge.

In the embodiment, the exhaust path is a flow path for discharging the gas into the atmosphere. That is, the exhaust path is formed in a non-circulating form, and once the gas is exhausted from the container, it is released into the atmosphere and will not be supplied into the container again. In contrast to the conventional NMR probe in which the exhaust path is merely regarded as a path for discarding the gas, in the present embodiment, the exhaust path is regarded as a path capable of controlling the pressure in the container and is provided with the adjustment mechanism.

In the embodiment, during NMR measurement, the adjustment mechanism maintains an average pressure inside the container at a higher pressure than that which exists without the adjusting mechanism. In most cases, for the NMR probe in which gas is not circulated, the pressure in the container is slightly above the atmosphere pressure (1 atm) when the adjustment mechanism is not provided. This is because the pressure is determined by the balance between the supplied relatively high-pressure cooling gas and the exhaust path that is connected with the atmosphere. The present embodiment maintains a higher pressure than in the container of the NMR probe having no adjustment mechanism. If the pressure in the container of the NMR probe having no adjustment mechanism is assumed to be about 1.1 to 1.2 atm, then in the present embodiment, the pressure is maintained at, for example, 1.3 atm or higher. If the pressure in the container of the NMR probe having no adjustment mechanism is kept slightly higher than the above pressure due to the size of the exhaust path or the shape of the container, then, in the present embodiment, the pressure is kept higher than that pressure (such as, for example, 1.4 atm or higher, 1.5 atm or higher, 1.6 atm or higher, 1.8 atm or higher, or 2 atm or higher).

The pressure in the container is considered to be relatively higher near the supply port for supplying the gas to the container and relatively uniform at positions other than that (however, the pressure fluctuates in time and space). In consideration of this, in the present embodiment, an average pressure in the container indicates an average value over time and space in the space except for the high-pressure portion near the supply port. However, the average pressure in the container is usually almost the same as the pressure in the exhaust path. For the sake of simplicity, the pressure in the exhaust path is monitored and adjusted, to thereby enable the average pressure in the container to be maintained at a target pressure.

In the embodiment, the supply paths are provided with pumps for pressurizing gas and supplying it to the container, and the exhaust path and the supply paths are connected to form a closed loop for circulating the gas. Conventionally, the circulation flow path has been merely provided with a mechanism for supplying gas to the container, such as a pump. In the present embodiment, apart from such a mechanism for supplying gas, the adjustment mechanism for adjusting the pressure in the container is provided in the exhaust path located on the upstream side thereof, to thereby enable the pressure in the container to be adjusted in a flexible manner.

The method of using the NMR probe system according to the embodiment includes the step of changing the pressure in the container by means of the adjustment mechanism when the voltage applied to the NMR circuit is changed. The method of using the NMR probe system according to the embodiment also includes the step of adjusting the pressure in the container by means of the adjustment mechanism when the type of gas supplied to the inside of the container is changed. The method of using the NMR probe system may be carried out by, for example, support staff of a company manufacturing or selling the NMR probe system, or a user using the NMR probe system. The method may also be carried out automatically by computer control.

(B) Details of Embodiment

Hereinafter, an embodiment will be described with reference to the drawings. Although, in the description, specific aspects will be described for easy understanding, these aspects exemplify the embodiment, a variety of other embodiments are possible.

FIG. 1 is a diagram showing a schematic structure of an NMR probe system 10 according to the present embodiment. The NMR probe system 10 together with a static magnetic field generator and a computer (not shown) constitute an NMR measurement apparatus. The NMR probe system 10 includes an NMR probe 12, a spectrometer control unit 40, and a gas control unit 50.

The NMR probe 12 is composed of a container 14 and a lower unit 15. The container 14 is an airtight container and is formed to have a cylindrical shape extending in the vertical direction. Upon measurement, the container 14 is inserted into a bore of the static magnetic field generator (not shown). Although, in the example shown, the container 14 is composed of a single container, the container 14 may be formed to have, for example, a double structure of an inner container and an outer container and a vacuum therebetween to enhance thermal insulation.

The inside of the container 14 is partitioned by frames 16 into a plurality of ventilated spaces. In the example of FIG. 1, the top space is a sample installation chamber 18 which is an example of the sample installation unit, and a sample tube 20 including a sample therein is installed in the sample installation chamber 18. At the installation position of the sample tube 20, a rotating mechanism for rotating the sample tube 20 inclined at the magic angle at high speed is provided. The sample tube 20 is installed in this rotating mechanism. In addition, a transmitting and receiving coil is disposed around the sample tube 20 (not shown).

The space located directly under the sample installation chamber 18 is an electric circuit chamber 22. In the electric circuit chamber 22, an electric circuit connected to the transmitting and receiving coil is installed. This electric circuit and the transmitting and receiving coil constitute an NMR circuit. The NMR circuit in the electric circuit chamber 22 includes a variable capacitor 24 constituting a tuning circuit or a matching circuit.

Cooling gas is supplied into the container 14 through a bearing gas supply path 26 and a drive gas supply path 28. The bearing gas supply path 26 guides the cooling gas supplied from the gas control unit 50 and releases the cooling gas from a supply port 26a to near the sample tube 20 in the sample installation chamber 18. This cooling gas is used to cool the inside of the container 14 including the sample tube 20 as well as to serve as a bearing for the sample tube 20 in the rotating mechanism described above. The drive gas supply path 28 also guides the cooling gas supplied from the gas control unit 50 and releases the cooling gas from a supply port 28a to near the sample tube 20 in the sample installation chamber 18. This cooling gas is used to cool the inside of the NMR probe 12 including the sample tube 20 as well as to serve as drive gas for driving the sample tube 20 to rotate in the rotating mechanism described above.

The exhaust path 30 is a flow path for exhausting the cooling gas from the inside of the container 14. The exhaust path 30 extends from an exhaust port 30a provided in the lower portion of the container 14 to the gas control unit 50.

The spectrometer control unit 40 is a device for controlling the NMR circuit. The spectrometer control unit 40 is composed of computer hardware and software for controlling the hardware. The spectrometer control unit 40 performs processing of generating radio waves in the NMR circuit, adjusting the timing of emission of the radio waves, amplifying signals detected by the transmitting and receiving coil to obtain a spectrum, and the like. The spectrometer control unit 40 and the NMR probe are wire-connected to transmit and receive electrical signals 42.

The spectrometer control unit 40 also provides instructions to control cooling gas in the gas control unit 50. More specifically, the spectrometer control unit 40 transmits, to the gas control unit 50, rotational speed instructions 44 to instruct the rotational speed of the sample tube 20. The spectrometer control unit 40 also obtains pressure information 46 of the cooling gas measured by, for example, a plurality of valves of the gas control unit 50. The spectrometer control unit 40 then transmits valve control instructions 48 to instruct the amount of opening and closing of the valves to the gas control unit 50.

The gas control unit 50 has a computer unit composed of computer hardware and software for controlling the hardware and also has a group of mechanical devices including, for example, the plurality of valves, a pump, and a compressor. Based on the instructions from the spectrometer control unit 40, the gas control unit 50 adjusts the amount of cooling gas that flows to the bearing gas supply path 26 and the drive gas supply path 28, and adjusts the pressure of the cooling gas exhausted from the exhaust path 30.

General operations of the NMR probe system 10 will now be described briefly. In the NMR probe 12, after the sample tube 20 is installed in the sample installation chamber 18, the container 14 of the NMR probe 12 is inserted into the bore of the static magnetic field generator (not shown). At this time, the spectrometer control unit 40 transmits the valve control instructions 48 to the gas control unit 50 to cause the gas control unit 50 to open and close the valves. The cooling gas is then allowed to flow to the rotating mechanism, in which the cooling gas will support the sample tube 20, from the supply port 26a of the bearing gas supply path 26 and the supply port 28a of the drive gas supply path 28. Thus, the sample tube 20 is rotated at high speed. The spectrometer control unit 40 appropriately adjusts the pressure and the amount of cooling gas supplied based on the pressure information detected by the gas control unit 50.

The spectrometer control unit 40 also transmits electrical signals 42 to the NMR probe 12 to control the NMR circuit. Specifically, the NMR circuit controls, for example, the frequency and timing of generation or emission of radio waves, and detects NMR signals and transmits them to the spectrometer control unit 40. Upon such processing, a high voltage is applied to the variable capacitor 24 constituting the tuning circuit or the matching circuit in the NMR circuit.

The spectrometer control unit 40, for example, amplifies the obtained NMR signals and obtains a spectrum. The data thus obtained is transmitted to the computer (not shown) and provided for data processing performed according to the instructions from the user. Thus, various types of information that constitute the sample (for example, information of nuclear magnetic interaction) can be obtained.

Figure 2:
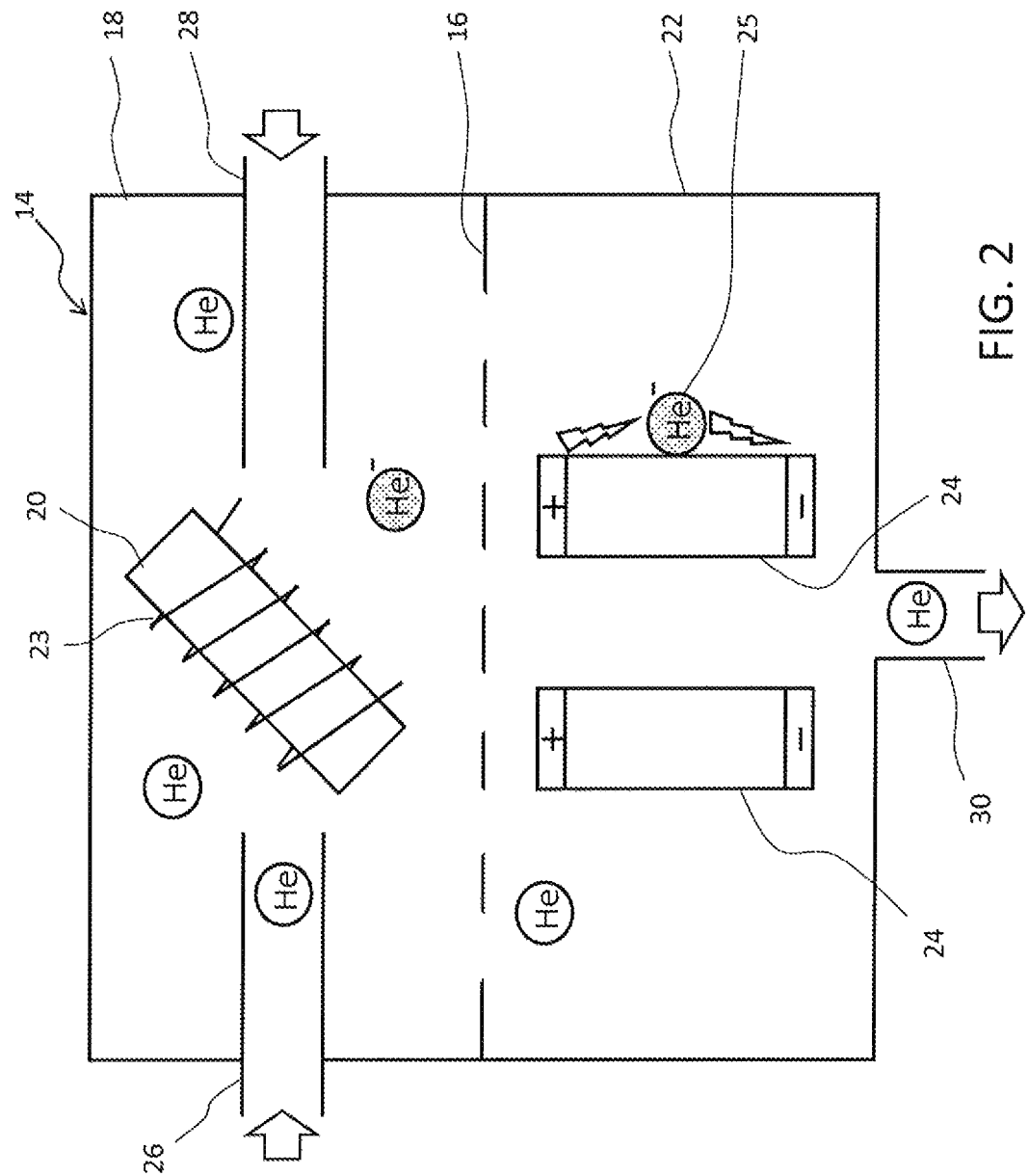
FIG. 2 is a conceptual diagram illustrating occurrence of discharge.

Next, a discharge phenomenon in the NMR circuit will be described with reference to FIG. 2. FIG. 2 is a diagram schematically showing the inside of the container 14 of the NMR probe 12.

The container 14 is partitioned by the frames 16 into the sample installation chamber 18 and the electric circuit chamber 22 in a ventilated manner. In the sample installation chamber 18, the sample tube 20 is inclined at the magic angle and installed in the rotating mechanism. Cooling gas is supplied to the rotating mechanism from the bearing gas supply path 26 and the drive gas supply path 28, and the sample tube 20 is driven to rotate at high speed. The supplied cooling gas diffuses in the container 14 so as to make the pressure inside the container constant, and then flows out to the exhaust path 30. In FIG. 2, helium molecules 25 are shown as an example of the cooling gas.

A transmitting and receiving coil 23 is wound around the sample tube 20. This transmitting and receiving coil 23 is electrically coupled to electric circuit parts installed in the electric circuit chamber 22, such as the variable capacitor 24, and constitutes the NMR circuit together with these electric circuit parts. The NMR circuit disposed inside the container 14 receives a high voltage, and due to collisions of electrons generated by the electric field of the voltage, the helium molecules 25 are ionized. Ions are also generated stochastically even when there is no influence of the NMR circuit.

For example, in the case of the variable capacitor, the generated helium molecular ions flow on the surface of the variable capacitor due to the voltage applied to electrodes at both ends. This breaks the insulation of the variable capacitor and causes discharge. FIG. 2 is a diagram showing a discharge phenomenon caused by helium molecular ions when a high voltage is applied to the variable capacitor.

When a discharge occurs, an electric current that should originally not flow to the NMR circuit flows thereto, leading to inaccurate NMR measurements. In addition, when the amount of discharge is large, it may lead to failure of the devices constituting the NMR circuit. Failure restoration requires, for example, part replacement, which requires time and cost. In consideration of this, the NMR probe system 10 according to the present embodiment controls the gas pressure so as to prevent or reduce discharge in the NMR circuit.

Figure 3:
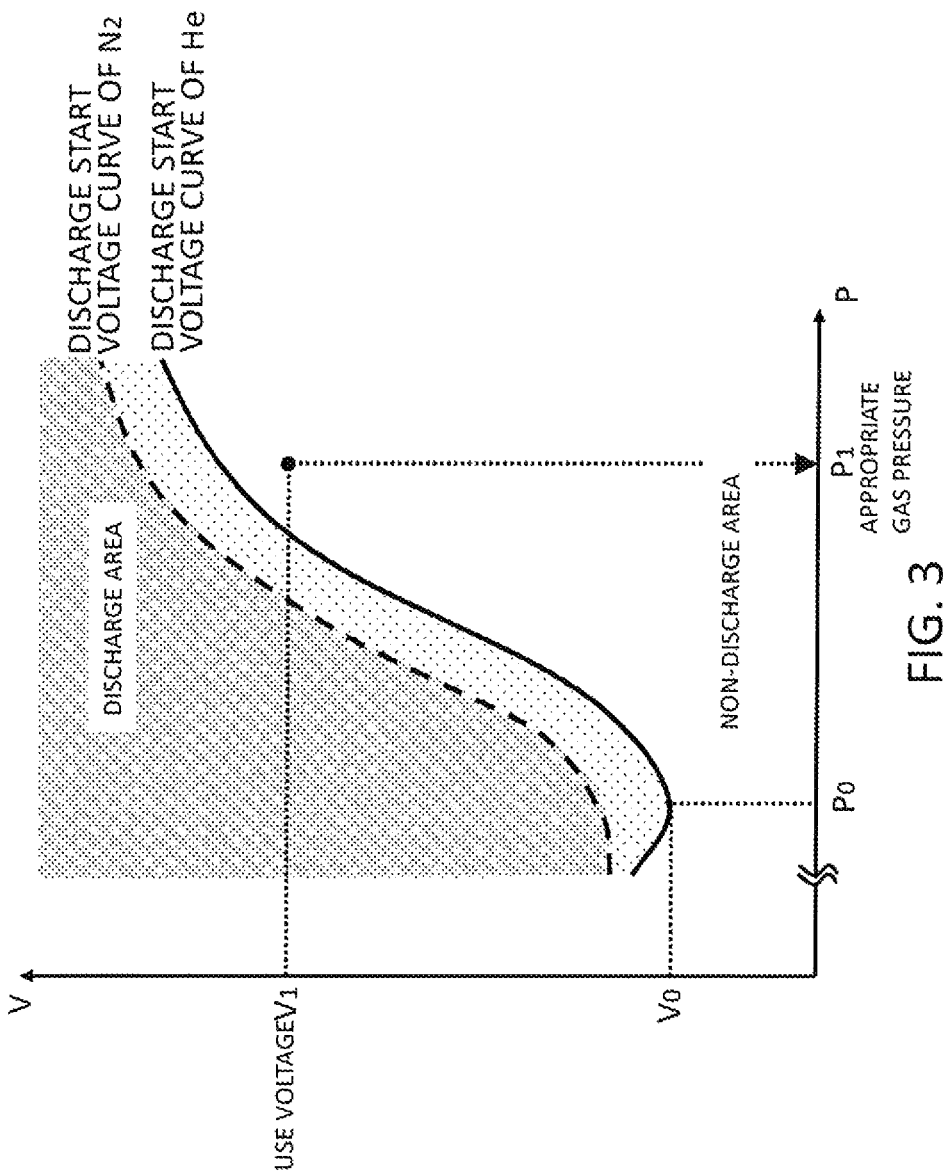
FIG. 3 is a diagram showing the relation between gas pressure and occurrence of discharge.

FIG. 3 is a diagram illustrating Paschen's law (experiment rule) showing the relationship between discharge and gas pressure between parallel electrodes. The horizontal axis indicates gas pressure P around the electric circuit, while the vertical axis indicates voltage V applied to the electric circuit.

The solid curve in the figure is a discharge start voltage curve when gas around the electric circuit is helium, while the broken curve is a discharge start voltage curve when the gas is nitrogen. If, for example, the periphery of the electric circuit is filled with helium maintained at an appropriate gas pressure, and the voltage is increased gradually, a discharge starts when a certain voltage is reached. The discharge start points are obtained for a plurality of gas pressures, and the results are approximated by a curve, to thereby obtain the discharge start voltage curve for helium. Although errors are included to some extent, the lower side (lower voltage side) of the discharge start voltage curve is a non-discharge area where no discharge occurs, and the upper side (higher voltage side) is a discharge area where discharge occurs.

Concerning the discharge start voltage curve for helium, when the gas pressure is P0, the discharge start voltage is V0, which is minimum. That is, in the area where the gas pressure is smaller than P0, the discharge start voltage decreases as the gas pressure increases. Meanwhile, in the area where the gas pressure is higher than P0, the discharge start voltage increases as the gas pressure increases. Although a value of the gas pressure P0 varies depending on the type of gas and circuit characteristics, it is, for example, about 0.01 to 0.05 atm. In addition, the discharge start voltage at that time is determined by the circuit characteristics.

The NMR circuit includes a plurality of types of electric circuit parts having various characteristics. Each electric circuit part is considered to have its own a discharge start voltage curve. Therefore, to prevent occurrence of discharge in a given NMR circuit structure, it is possible to cause all electric circuit parts constituting the NMR circuit to operate under a voltage and a gas pressure belonging to the non-discharge area on the lower side of discharge start voltage curves (in consideration of errors). However, in the NMR probe 12, the voltage to be applied to the electric circuit parts is determined according to measurement requirements, the voltage cannot be adjusted arbitrarily, and so in the present embodiment the gas pressure is adjusted.

In the present embodiment, as shown in FIG. 3, control is carried out such that when, concerning an electric circuit part that is most prone to discharge, its use voltage V1 (which is assumed to be a maximum value in a series of measurements) is applied to the electric circuit part, the gas pressure belonging to the non-discharge area is applied. However, the gas pressure does not have to be increased more than necessary. Operation at too high a gas pressure will place a higher load on the devices. Therefore, the gas pressure P1 is appropriately determined to be within a range that is not too high.

Such control of the gas pressure can be carried out in various ways. For example, it is possible to adopt an aspect in which, for a gas having the lowest discharge start voltage among the types of gases that may be used, such as nitrogen, helium, and air, the appropriate gas pressure P1 corresponding to the maximum use voltage V1 that may be applied is determined, and the pressure in the container 14 is maintained at that gas pressure P1 (or the gas pressure higher than that). Although this aspect is the safest control method, a gas pressure that is higher than necessary is applied under most measurement conditions.

Alternatively, it is possible to adopt an aspect in which the gas pressure that is a control target is changed when the measurement conditions are changed. For example, when the type of gas used is changed to another type of gas, the appropriate gas pressure P1 for the maximum use voltage V1 assumed to be used is determined for the other type of gas. The control target gas pressure is then changed so as to maintain the pressure inside the container 14 at that gas pressure P1 (or a gas pressure higher than that). In this aspect, the gas pressure is adjusted according to the gas that is actually used, and thus, the degree of optimality of the gas pressure increases.

It is also possible to adopt an aspect in which after the frequency of radio waves to be emitted or the like is set, and the voltage to be applied is determined, the appropriate gas pressure P1 corresponding to the maximum use voltage V1 to be used during that measurement period is determined. In this aspect, control is carried out by using that gas pressure P1 (or the gas pressure higher than that) as the control target gas pressure. In this aspect, the gas pressure is optimized in each measurement.

The discharge start voltage curve cannot always be understood accurately in the NMR circuit. For example, even for electric circuit parts of the same type, their discharge start voltage curves may differ according to their individual differences. Therefore, it should be considered that the appropriate gas pressure P1 corresponding to the use voltage V1 may include a considerable error. However, even if such a case is taken into account, the qualitative prediction that the appropriate gas pressure increases as the use voltage increases (when the gas pressure P0 or higher) is possible, and thus, the operation of increasing the gas pressure is effective to prevent or reduce discharge. It is also certain that the discharge start curve shifts, for example, depending on the type of gas, and thus, the operation of increasing the gas pressure is effective when the type of gas having a low discharge start voltage is used.

Figure 4:
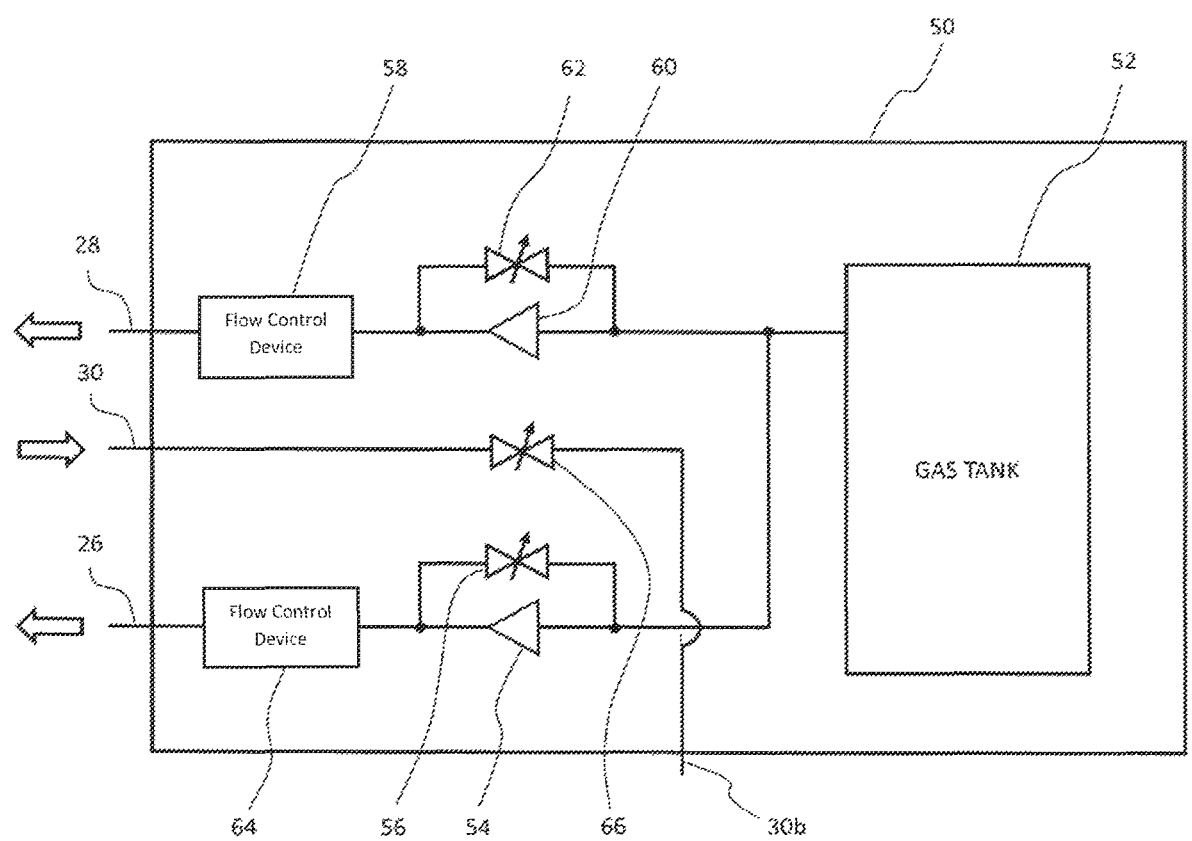
FIG. 4 is a diagram showing an example of a gas control unit that performs non-circulating gas control.

Next, an aspect of control by the gas control unit 50 will be described with reference to FIG. 4. In this example, the gas control unit 50 has a gas tank 52. The gas tank 52 is filled with, for example, liquid nitrogen, and the liquid nitrogen is vaporized as required and guided to a gas flow path. The gas flow path is branched into two: one is connected to the bearing gas supply path 26, and the other is connected to the drive gas supply path 28. The bearing gas supply path 26 is connected to a pump 54 and a pressure control valve 56 in parallel and is also connected to a flow control device 58 downstream of them. The pump 54 pressurizes gas that flows to the bearing gas supply path 26. The pressure control valve 56 is a valve for adjusting the gas pressure in the bearing gas supply path 26. The flow control device 58 controls the flow rate of cooling gas that flows to the bearing gas supply path 26. Similarly, the drive gas supply path 28 is connected to a pump 60, a pressure control valve 62, and a flow control device 64.

The gas control unit 50 is also connected to the exhaust path 30 extending from the container 14. An open port 30b of the exhaust path 30 is kept open in the atmosphere. That is, once the cooling gas exhausted from the exhaust path 30 is released into the atmosphere, it is not used again. In this regard, it can be said that non-circulating gas control is carried out in the gas control unit 50. A pressure control valve 66 is provided in the middle of the exhaust path 30.

In the gas control unit 50, for example, a gas pressure of about 2 to 6 atm is applied to the bearing gas supply path 26 to supply cooling gas to the container 14. In addition, for example, a gas pressure of about 2 to 4 atm is applied to the drive gas supply path 28 to supply cooling gas to the container 14. These pressures serve to provide a bearing for the sample tube 20 and drive the sample tube 20 to rotate. After being blown to the sample tube 20, the cooling gas diffuses in the entire container 14 while reducing the pressure, and is soon exhausted from the exhaust path 30.

The pressure control valve 66 provided in the exhaust path 30 is an example of the adjustment mechanism and adjusts the pressure in this exhaust path 30. If the pressure control valve 66 is fully opened, the pressure in the exhaust path 30 has a value that is relatively close to the atmosphere pressure through the open port 30b, which is open to the atmosphere. Although the pressure in the container 14 in communication with the exhaust path 30 is considered to be slightly higher than that in the exhaust path 30 due to the influence of friction in the exhaust path 30 or the like, in most cases, the difference is small, and the pressure in the container 14 has almost the same value as that in the exhaust path 30. Specific values of the pressures in the exhaust path 30 and the container 14 vary depending on the pressure and the amount of cooling gas supplied from the bearing gas supply path 26 and the drive gas supply path 28 as well as the size and the length of the exhaust path 30, but they are about 1.1 to 1.2 atm, for example.

If the gas control unit 50 controls the pressure control valve 66, in the exhaust path 30, the gas pressure on the upstream side relative to the pressure control valve 66 is increased, and the container 14 will have a gas pressure that is almost equal to this gas pressure. Thus, in comparison with the case where the pressure control valve 66 is not provided, it becomes possible to increase the gas pressure in the container 14 and prevent or reduce discharge in the NMR circuit. The specific gas pressure can be finely adjusted by the pressure control valve 66. The pressure control valve 66 is provided with a pressure gauge (gas sensor), and the pressure gauge enables the pressure in the container 14 to be increased to, for example, 1.3 atm, 1.4 atm, 1.5 atm, 1.6 atm, 1.7 atm, 1.8 atm, 2.0 atm, 2.2 atm, 2.5 atm, and so on. Alternatively, it is also possible to control the pressure control valve 66 to open and close while monitoring the pressure gauge provided inside the container 14.

The discharge prevention effect in the NMR circuit is enhanced as the gas pressure in the container 14 is increased by the pressure control valve 66. However, if the gas pressure in the container 14 is increased, the effects of providing a bearing for the sample tube 20 and driving the tube to rotate by using the atmospheric pressure difference is reduced. In consideration of this, it is also possible to increase the pressure of cooling gas supplied to the bearing gas supply path 26 and the drive gas supply path 28.

The pressure control valve 66 in the gas control unit 50 can be controlled automatically by the gas control unit 50, for example, according to the settings set by the manufacturer, the seller, or the user of the NMR probe system 10, or after a target pressure is preset according to programming. The pressure control valve 66 may also be controlled manually, for example, by the manufacturer, the seller, or the user of the NMR probe system 10.

Figure 5:
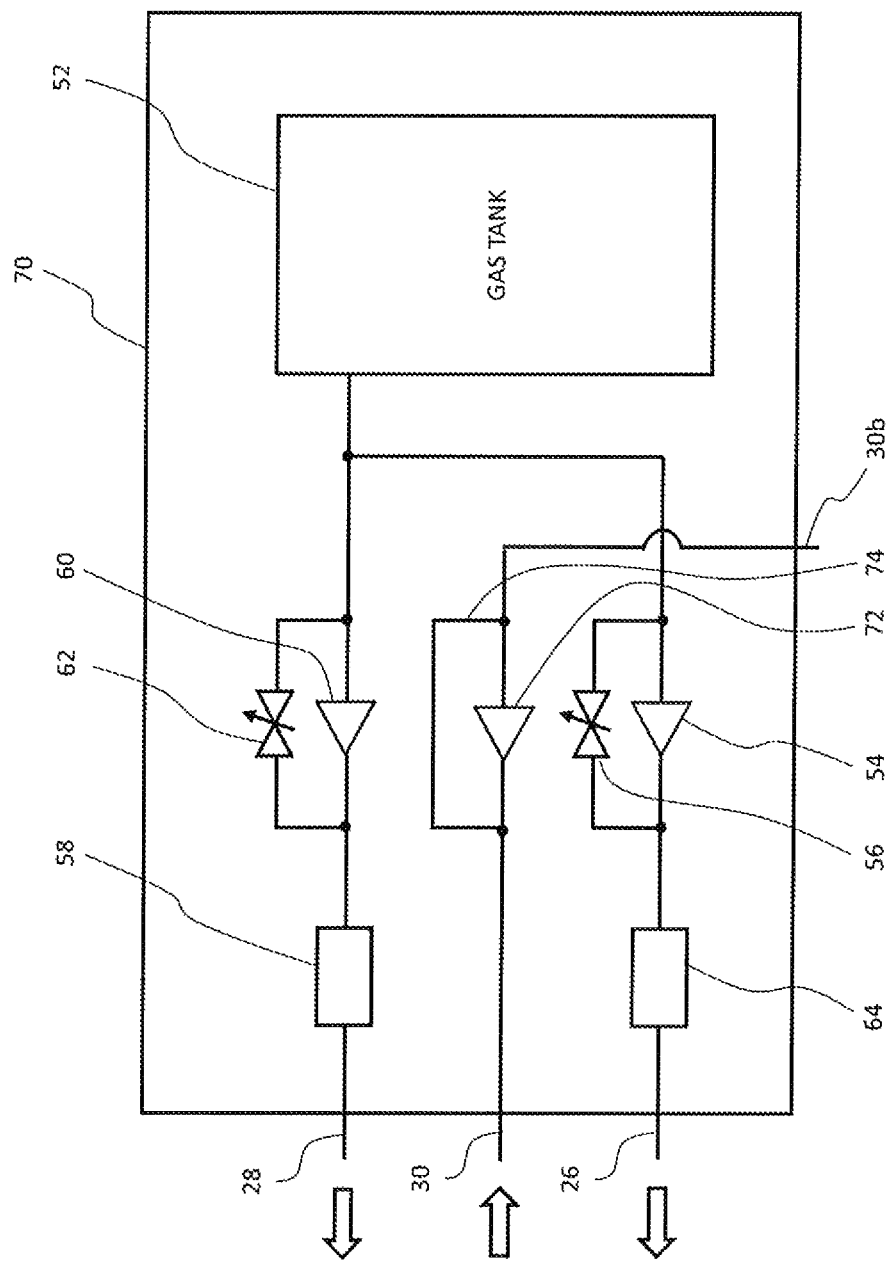
FIG. 5 is a diagram showing a variant of the gas control unit that performs non-circulating gas control.
Figure 6:
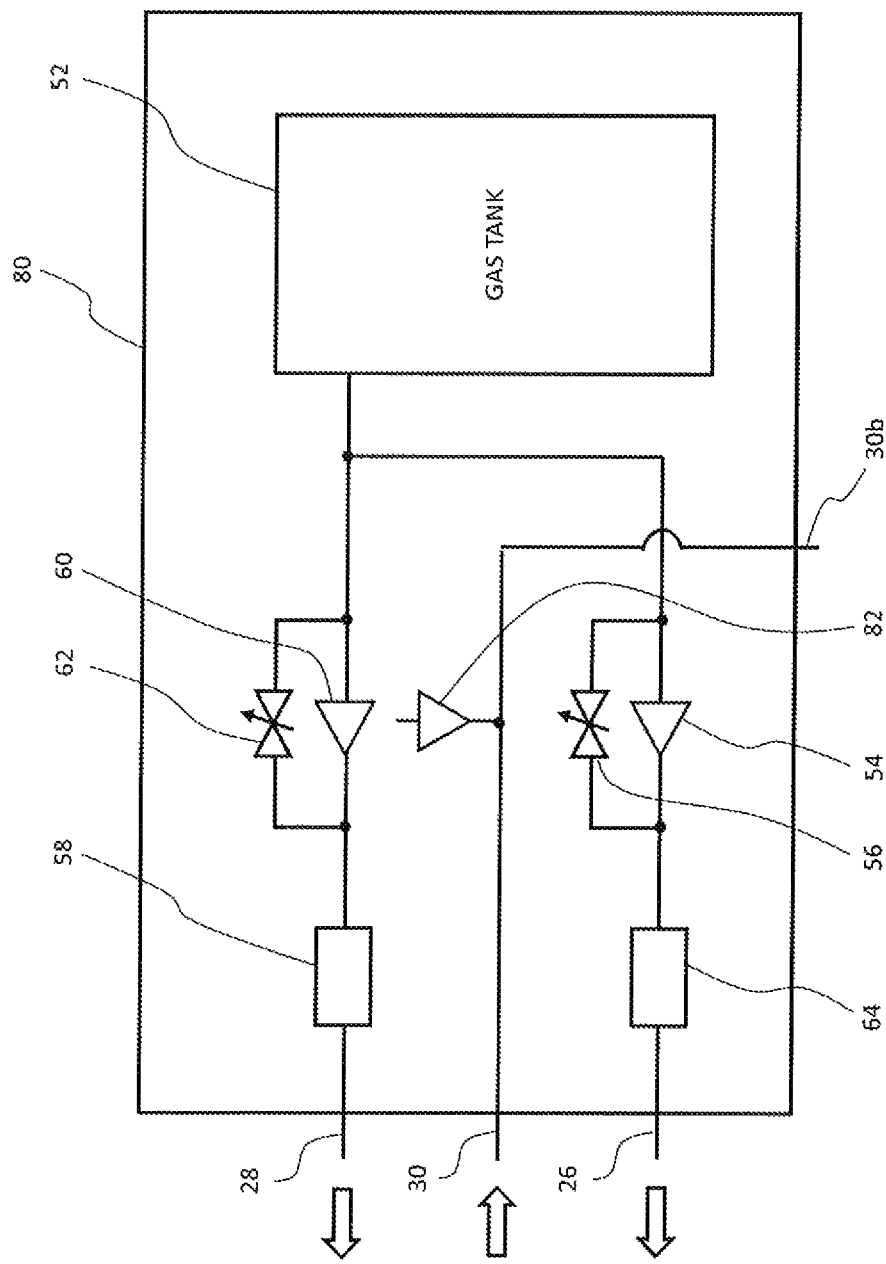
FIG. 6 is a diagram showing another variant of the gas control unit that performs non-circulating gas control.

Next, a variant of the embodiment of non-circulating gas control shown in FIG. 4 will be described with reference to FIGS. 5 and 6. In FIGS. 5 and 6, the components that are the same as or correspond to those in FIG. 4 are denoted by the same reference numerals, and their description will be omitted or simplified.

In a gas control unit 70 shown in FIG. 5, the exhaust path 30 is connected to a pump 72 and a bypass path 74 in parallel. The pump 72 is an example of the adjustment mechanism and is installed so as to form a flow toward the upstream side. When the pump is not driven, some of the cooling gas flowing from the container 14 to the exhaust path 30 flows to the bypass path 74 and returns to the exhaust path 30. Taken as a whole, this results in almost the same flow as when there is no bypass path 74 or pump 72 in the exhaust path 30.

When the pump 72 is driven, a backflow is created in the exhaust path 30. Therefore, in the exhaust path 30, the pressure is increased on the upstream side relative to the pump 72, and the gas pressure in the container 14 is also increased. The cooling gas is then exhausted from the open port 30b via the bypass path 74. In the gas control unit 70, as the driving output of the pump 72 is increased, the gas pressure in the container 14 can be increased. In this embodiment, by controlling the driving output of the pump 72 based on the pressure detected by the pressure gauge provided in the exhaust path 30 or the container 14, it becomes possible to perform fine pressure adjustment.

In a gas control unit 80, a pump 82, which is an example of the adjustment mechanism, is installed toward the exhaust path 30. When the pump 82 is not driven, there is no obstacle for the flow of cooling gas in the exhaust path 30, and the cooling gas is exhausted from the open port 30b without being disturbed. When the pump 82 is driven, the gas pressure is increased in the exhaust path 30. Then, the gas pressure increases on the upstream side, and the pressure also increases in the container 14. Although the gas pressure also tends to increase on the downstream side, the cooling gas is quickly exhausted from the open port 30b, and thus, the gas pressure does not become so high. Thus, in the gas control unit 80, as the driving output of the pump 82 is increased, the gas pressure in the container 14 can be increased. In this embodiment, by controlling the driving output of the pump 82 based on the pressure detected by the pressure gauge provided in the exhaust path 30 or the container 14, it becomes possible to perform fine pressure adjustment.

Figure 7:
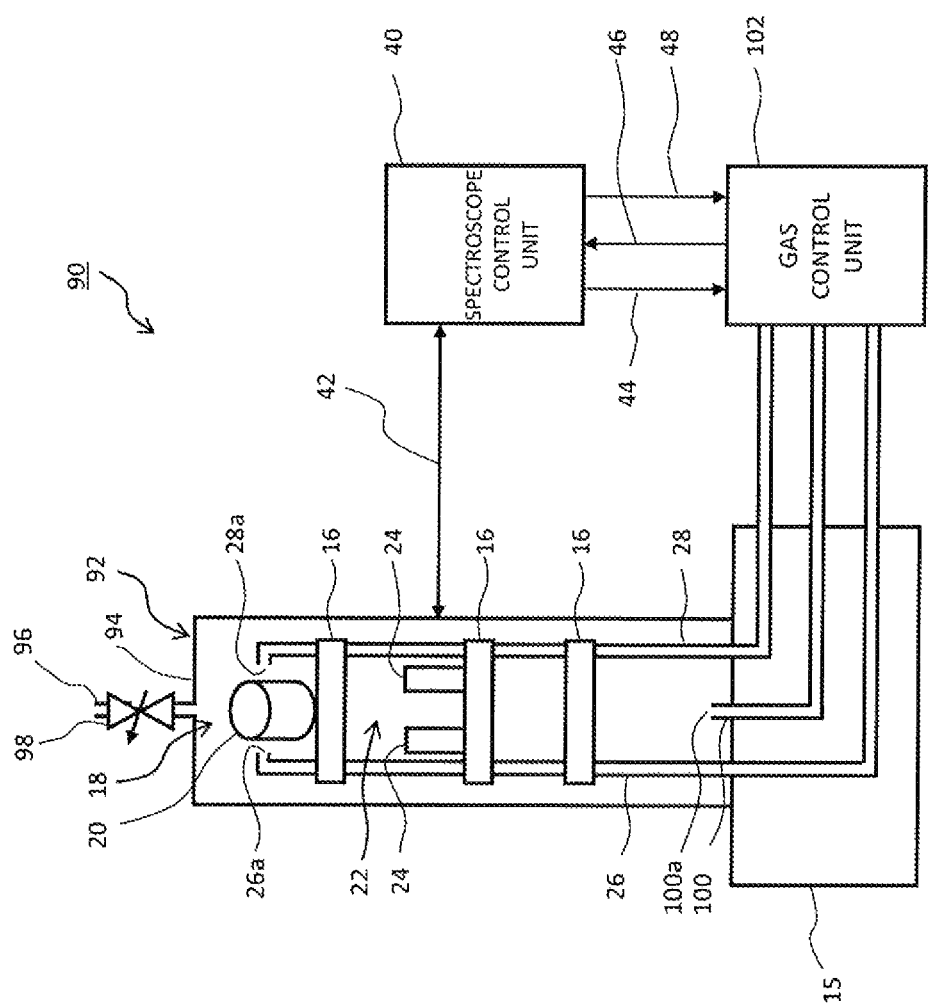
FIG. 7 is a schematic diagram of an NMR probe system that differs in the structure of supply paths and an exhaust path.

Next, another embodiment of non-circulating gas control will be described with reference to FIG. 7. FIG. 7 is a diagram corresponding to FIG. 1 but shows a schematic structure of an NMR probe system 90 according to the another embodiment. The components that are the same as or correspond to those in FIG. 1 are denoted by the same reference numerals, and their description will be omitted or simplified.

In the NMR probe system 90 shown in FIG. 7, an exhaust path 96 is provided on the top of a container 94 of an NMR probe 92. A pressure control valve 98 which is an example of the adjustment mechanism is provided in the exhaust path 96. In addition, in place of the exhaust path 30 in FIG. 1, a gas supply path 100 is provided in the lower portion of the container 94. Gas is supplied to the container 94 from a supply port 100a at the tip of the gas supply path 100.

A gas control unit 102 controls the gas pressure and the amount of cooling gas supplied to the bearing gas supply path 26 and the drive gas supply path 28 in a manner similar to that in the gas control unit 50 shown in FIG. 1. The gas control unit 102 also controls the gas pressure and the amount of cooling gas supplied to the container 94 through the gas supply path 100. The gas control unit 102 further controls the pressure control valve 98 connected to the exhaust path 96.

In this NMR probe system 90, cooling gas is supplied to the container 94 through the bearing gas supply path 26, the drive gas supply path 28, and the gas supply path 100. The cooling gas is then exhausted from the exhaust path 96 and released into the atmosphere. If the pressure control valve 98 in the exhaust path 96 is open, the pressure in the container 94 is maintained at the pressure close to the atmospheric pressure (for example, 1.1 to 1.2 atm). Then, as the pressure control valve 98 is closed, the pressure in the container 94 is increased.

Figure 8:
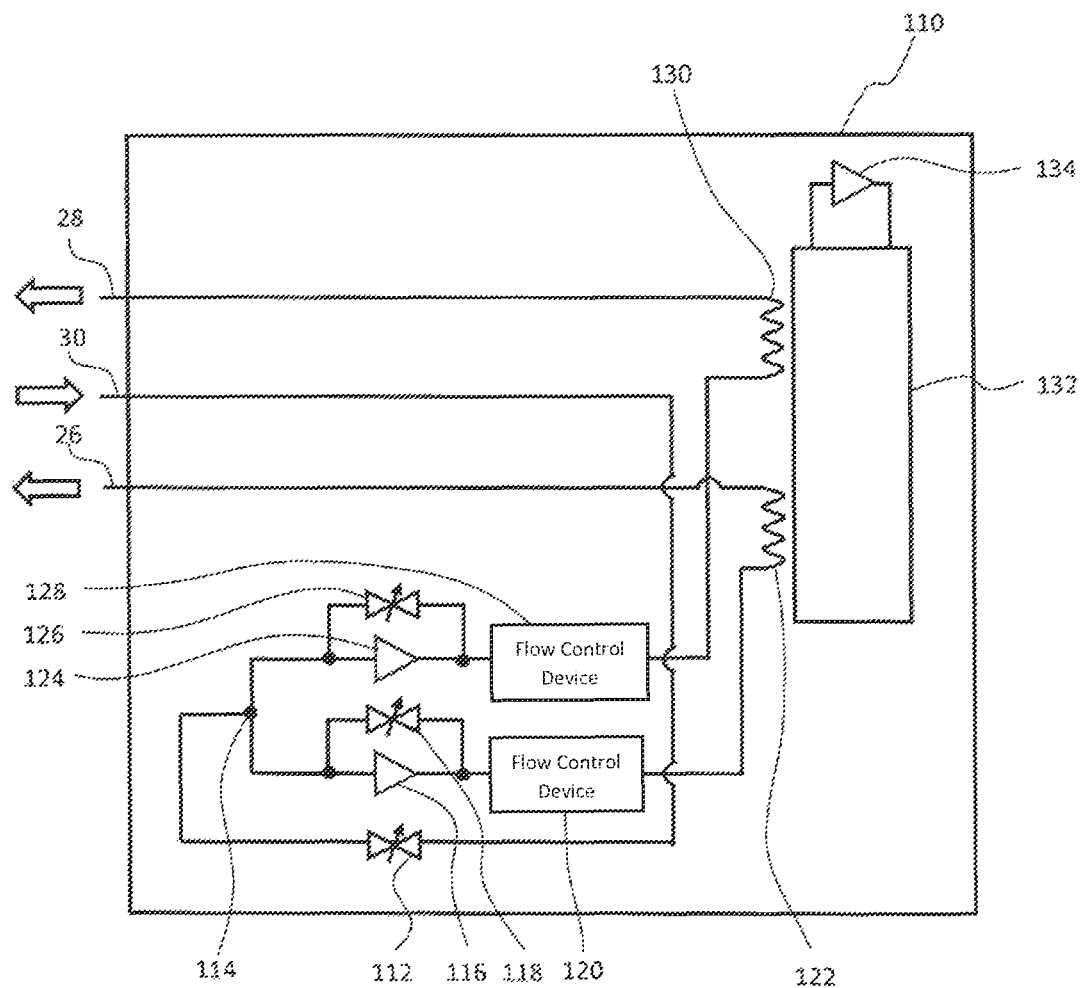
FIG. 8 is a diagram showing an example of a gas control unit that performs circulating gas control.

Next, circulating gas control will be described with reference to FIG. 8. FIG. 8 is a diagram showing a gas control unit 110 used in place of the gas control unit 50 shown in FIGS. 1 and 4.

Like the gas control unit 50, the gas control unit 110 is coupled to the bearing gas supply path 26, the drive gas supply path 28, and the exhaust path 30 that are connected to the container 14. In the gas control unit 110, a pressure control valve 112 which is an example of the adjustment mechanism is connected to the exhaust path 30. At a branching point 114 on the downstream side of the pressure control valve 112, the exhaust path 30 is branched into two: one is connected to the bearing gas supply path 26, and the other is connected to the drive gas supply path 28.

The bearing gas supply path 26 is connected to a pump 116 and a pressure control valve 118 in parallel, and is also connected to a flow control device 120 and a heat exchanger 122 on the downstream side thereof. The pump 116 pressurizes gas that flows to the bearing gas supply path 26. The pressure control valve 118 is a valve for adjusting the gas pressure in the bearing gas supply path 26. The flow control device 120 controls the flow rate of cooling gas that flows to the bearing gas supply path 26. The heat exchanger 122 is a device for exchanging heat with a cold head 132 to cool the cooling gas. Similarly, the drive gas supply path 28 is connected to a pump 124, a pressure control valve 126, a flow control device 128, and a heat exchanger 130. The cold head 132 is a cooling device cooled by a helium compressor 134.

In the gas control unit 110, the cooling gas exhausted from the container 14 through the exhaust path 30, is branched by the branching point 114 into the bearing gas supply path 26 and the drive gas supply path 28, and fed to the container 14 again. As such, the cooling gas is circulated in a closed loop, and it can thus be said that circulating gas control is carried out in the gas control unit 110.

During circulation process, in the bearing gas supply path 26, the pump 116, the pressure control valve 118, and the flow control device 120 control the pressure and the flow rate of the cooling gas fed to the container 14. In addition, in the drive gas supply path 28, the pump 124, the pressure control valve 126, and the flow control device 128 control the pressure and the flow rate of the cooling gas fed to the container 14. Further, in the exhaust path 30, the pressure control valve 112 controls the pressure in the exhaust path 30 and the container 14 on the upstream side thereof.

However, in the gas control unit 110, the exhaust path 30 is connected to the bearing gas supply path 26 and the drive gas supply path 28, and therefore, they influence each other. For example, if the pressure control valve 112 is open in the exhaust path 30, the pressure in the exhaust path 30 and inside the container 14 is determined by the state on the upstream side of the pump 116 and the pressure control valve 118 in the bearing gas supply path 26 and the pump 124 and the pressure control valve 126 in the drive gas supply path 28. The specific pressure at this time is also determined depending on, for example, the total amount and the temperature of the circulating cooling gas. Then, as the pressure control valve 112 is throttled, the pressure in the exhaust path 30 and inside the container 14 increases gradually.

The pressure control valve 112 can thus change the pressure in the exhaust path 30 and inside the container 14 according to the amount of opening and closing. The pressure control valve 112 can perform fine pressure adjustment based on the pressure gauge provided in that pressure control valve 112 or the container 14. For example, the pressure control valve 112 can set the pressure higher than the open state by 0.2 atm or higher, 0.4 atm or higher, 0.6 atm or higher, 0.8 atm or higher, 1 atm or higher, 1.5 atm or higher, 2 atm or higher, 2.5 atm or higher, or 3 atm or higher.

As such, in the gas control unit 110 which performs circulating gas control, it is possible to perform gas pressure control to prevent or reduce occurrence of discharge in a manner similar to that in the gas control unit 50 which performs non-circulating gas control. The pressure control valve 112 is an example of a gas pressure adjustment mechanism, and, for example, the mechanisms shown in FIG. 5 and FIG. 6 may also be used. It is also possible to change the structure of the gas supply and exhaust paths including the bearing gas supply path 26, the drive gas supply path 28, and the exhaust path 30 constituting the closed loop. For example, heat exchangers 122 and 130 which exchange heat with the cold head 132 may be provided in the exhaust path 30. JP 2016-142537 A also discloses the structure in which a flow path and a valve are added in consideration of removal of the NMR probe 12. In either case, in the present embodiment, in addition to the pumps 116 and 126 in the supply paths, a mechanism for adjusting the pressure in the exhaust path 30 may be provided on the upstream side of the pumps 116 and 126.

Figure 9:
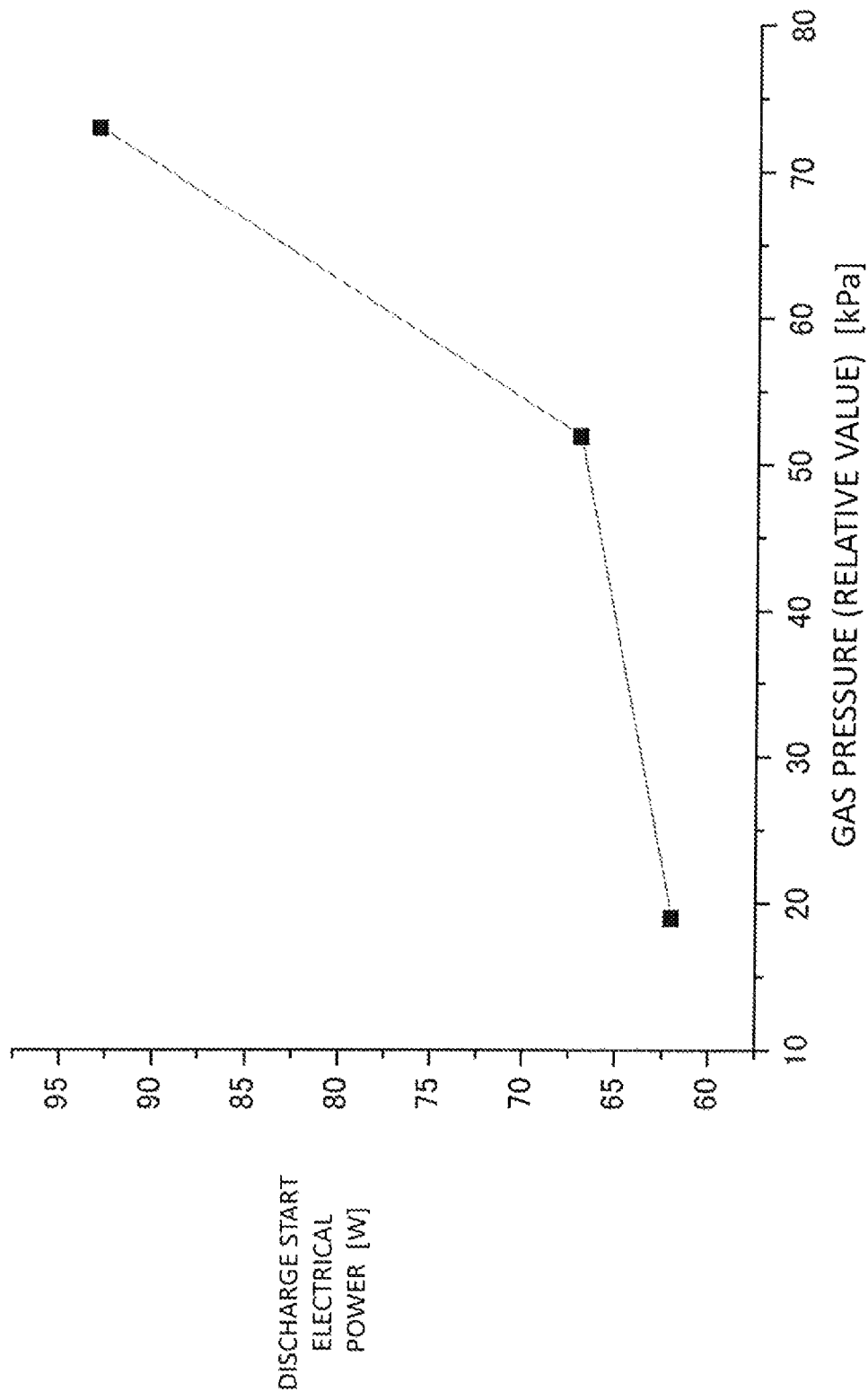
FIG. 9 is a relationship diagram between the pressure obtained by an experiment by means of the apparatus in FIG. 8 and discharge start power.

An experimental example of discharge start power will now be described with reference to FIG. 9. FIG. 9 shows the results of experiments performed by means of the gas control unit 110, which performs circulating gas control shown in FIG. 8.

FIG. 9 shows the discharge start power obtained when the flow rate in the exhaust path 30 was made constant (therefore, the flow rate of cooling gas supplied to the container 14 is also constant), and the gas pressure inside the container 14 was changed by means of the pressure control valve 112. The gas pressure in the horizontal axis is a relative value indicating, based on the open state of the pressure control valve 112 as a reference, how much the gas pressure increased from that reference. 100 kPa approximately corresponds to 1 atm. It should also be noted that the vertical axis indicates electric power, unlike FIG. 3. Power is proportional to the square of voltage.

According to FIG. 9, when the relative gas pressures are 19 kPa, 52 kPa, and 73 kPa, the discharge start powers are respectively 62 W, 67 W, and 93 W. Accordingly, it is recognized that as the gas pressure is increased, the discharge start voltage is increased, and thus, discharge becomes unlikely to occur. This qualitative tendency is consistent with the tendency in FIG. 3 exemplifying Paschen's law.

More specifically, when the relative gas pressure increases by 33 kPa, from 19 kPa to 52 kPa, the discharge start power increases by 5 W, from 62 W to 67 W. The ratio of change in discharge start power to change in gas pressure during this period is 0.15 (W/kPa). Further, when the relative gas pressure increases by 54 kPa, from 19 kPa to 73 kPa, the discharge start power increases by 31 W, from 62 W to 93 W. The ratio of change in discharge start power to change in gas pressure during this period is 0.57 (W/kPa). Therefore, it can be understood from FIG. 9 that the degree of increase in discharge start power rises as the gas pressure increases. In addition, by estimating the rate of change in voltage based on the square root of power (calculation omitted), it can be understood that the degree of increase in discharge start voltage rises as the gas pressure increases. That is, FIG. 9 shows that, within a realistic control range, the effect of discharge control increases in a non-linear manner with respect to the supplied gas pressure.

The invention claimed is:

1. An NMR probe system comprising:
    a container in which a sample installation unit and an NMR circuit are provided;
    supply paths that supply gas to an inside of the container;
    an exhaust path that exhausts the gas from the inside of the container; and
    an adjustment mechanism that is provided in the exhaust path and adjusts a pressure in the container,
    wherein the exhaust path is a flow path that releases the gas into an atmosphere, and wherein, during NMR measurement, the adjustment mechanism maintains an average pressure inside the container at a higher pressure than that which exists without the adjustment mechanism.

2. The NMR probe system according to claim 1, wherein, during NMR measurement, the adjustment mechanism maintains the average pressure inside the container at 1.3 atm or higher.

3. The NMR probe system according to claim 1, wherein
the supply paths are provided with pumps that pressurize the gas and supply the gas to the container, and
the exhaust path and the supply paths are connected to form a closed loop for circulating the gas.

4. A method of using the NMR probe system according to claim 1, the method comprising:
changing the pressure in the container by the adjustment mechanism when a voltage applied to the NMR circuit is changed.

5. A method of using the NMR probe system according to claim 1, the method comprising:
adjusting the pressure in the container by the adjustment mechanism when a type of gas supplied to the inside of the container is changed.

* * * * *